United States Patent
Kim et al.

(10) Patent No.: US 9,736,934 B2
(45) Date of Patent: Aug. 15, 2017

(54) TOUCH PANEL AND METHOD OF MANUFACTURING CONDUCTIVE LAYER FOR TOUCH PANEL

(71) Applicant: LG ELECTRONICS INC., Seoul (KR)

(72) Inventors: Minchul Kim, Cheongju-si (KR); Munsu Lee, Cheongju-si (KR)

(73) Assignee: LG ELECTRONICS INC., Seoul (KR)

( * ) Notice: Subject to any disclaimer, the term of this patent is extended or adjusted under 35 U.S.C. 154(b) by 122 days.

(21) Appl. No.: 14/480,246

(22) Filed: Sep. 8, 2014

(65) Prior Publication Data

US 2015/0068790 A1   Mar. 12, 2015

(30) Foreign Application Priority Data

Sep. 9, 2013 (KR) .................. 10-2013-0108045

(51) Int. Cl.
| | |
|---|---|
| *G06F 3/041* | (2006.01) |
| *H05K 1/02* | (2006.01) |
| *G06F 3/044* | (2006.01) |
| *H05K 1/11* | (2006.01) |
| *H05K 3/02* | (2006.01) |
| *H05K 3/46* | (2006.01) |

(52) U.S. Cl.
CPC .......... *H05K 1/0296* (2013.01); *G06F 3/044* (2013.01); *G06F 3/0416* (2013.01); *H05K 1/0274* (2013.01); *H05K 1/11* (2013.01); *H05K 3/027* (2013.01); *H05K 3/467* (2013.01); *G06F 2203/04103* (2013.01)

(58) Field of Classification Search
CPC ..... G06F 3/0416; G06F 3/044; H05K 1/0296; H05K 1/0274; H05K 1/11; H05K 3/467; H05K 3/027
See application file for complete search history.

(56) References Cited

U.S. PATENT DOCUMENTS

| | | | |
|---|---|---|---|
| 2009/0244028 A1 | 10/2009 | Matsuo | |
| 2011/0018560 A1* | 1/2011 | Kurashima | G06F 3/044 324/679 |
| 2011/0199341 A1* | 8/2011 | Reinfried | G06F 3/044 345/176 |
| 2011/0227846 A1 | 9/2011 | Imazeki | |
| 2011/0234505 A1* | 9/2011 | Kim | G06F 3/044 345/173 |
| 2011/0304566 A1 | 12/2011 | Han | |
| 2012/0229395 A1* | 9/2012 | Shin | G06F 3/0418 345/173 |
| 2012/0241199 A1* | 9/2012 | Kobayashi | G06F 3/044 174/250 |
| 2013/0141380 A1 | 6/2013 | Wang et al. | |

(Continued)

*Primary Examiner* — Steven T Sawyer
(74) *Attorney, Agent, or Firm* — Dentons US LLP

(57) ABSTRACT

A touch panel has an active area and a non-active area disposed at an outer side of the active area defined therein. The touch panel includes a support member and a conductive layer formed on the support member and including an electrode part in the active area to sense touch and a wiring part disposed in the non-active area to be connected to the electrode part. In the non-active area, the wiring part is disposed on the support member and the electrode part is partially disposed on the wiring part.

7 Claims, 11 Drawing Sheets

(56) References Cited

U.S. PATENT DOCUMENTS

| | | | |
|---|---|---|---|
| 2013/0169558 A1* | 7/2013 | Min | G06F 3/044 345/173 |
| 2013/0201122 A1 | 8/2013 | Kurashima et al. | |
| 2013/0292162 A1* | 11/2013 | Lee | H05K 3/10 174/257 |
| 2014/0152580 A1* | 6/2014 | Weaver | G06F 3/041 345/173 |

* cited by examiner (a)

(b)

(a)

(b)

(a)

(b)

(a)

(b)

(a)

(b)

TOUCH PANEL AND METHOD OF MANUFACTURING CONDUCTIVE LAYER FOR TOUCH PANEL

CROSS-REFERENCE TO RELATED APPLICATION

This application claims the priority benefit of Korean Patent Application No. 10-2013-0108045, filed on Sep. 9, 2013 in the Korean Intellectual Property Office, the disclosure of which is incorporated herein by reference in its entirety for all purposes as if fully set forth herein.

BACKGROUND

Disclosed embodiments relate to a touch panel and a method of manufacturing a conductive layer for touch panels and, more particularly, to a touch panel having an improved structure and a conductive layer for touch panels.

DESCRIPTION OF THE RELATED ART

Recently, touch panels have been applied to a variety of electronic devices such as display devices and the like to enhance user convenience. A touch panel includes a conductive layer with an electrode part to sense touch and a wiring part for connection to the outside.

In this regard, the electrode part is formed, and then the wiring part is formed thereon. Accordingly, during fabrication of the wiring part, the electrode part may be damaged or separated. To minimize occurrence of such damage or separation, fabrication processes of the wiring part are limited. Accordingly, there is a limitation in the ability for reducing the width of the wiring part, which may increase a non-active area that does not contribute to actual touch sensing.

SUMMARY

Disclosed embodiments provide a touch panel that may reduce the size of a non-active area and enhance adhesion between a support member, an electrode part, and a wiring part; and a method of manufacturing a conductive layer for touch panels.

In one embodiment, a touch panel having an active area and a non-active area formed at an outer side of the active area defined therein may include a support member and a conductive layer formed on the support member. The touch panel may further include an electrode part in the active area to sense touch and a wiring part disposed in the non-active area to be connected to the electrode part. In the non-active area, the wiring part is disposed on the support member, and the electrode part is partially disposed on the wiring part.

The electrode part may include a sensor part disposed in the active area and a wiring connection part electrically connected to the sensor part and disposed in the non-active area. The wiring part may include an electrode connection part disposed between the wiring connection part and the support member and a wiring extending from the wiring connection part.

The electrode connection part may be formed between the wiring connection part and the support member to be in contact therewith.

The electrode part may include a transparent conductive material including nanowires having a network structure.

The wiring part may include a metal layer formed by deposition.

The wiring may have a narrower width than the electrode connection part.

The electrode connection part may have a width of about 1 mm to about 5 mm, and the wiring may have a width of about 10 μm to about 100 μm.

The wiring may have a width of about 30 μm to about 60 μm.

The touch panel may further include a seed layer disposed between the wiring part and the support member.

In another embodiment, a method of manufacturing a conductive layer for a touch panel having an active area and a non-active area disposed at an outer side of the active area defined therein may include forming, on a support member comprising an active area and a non-active area disposed at an outer side of the active area, a conductive layer including an electrode part in the active area to sense touch and a wiring part disposed in the non-active area to be connected to the electrode part, wherein, in the non-active area, the wiring part is disposed on the support member and the electrode part is partially disposed on the wiring part.

The electrode part may include a sensor part disposed in the active area and a wiring connection part electrically connected to the sensor part and disposed in the non-active area. The wiring part may include an electrode connection part disposed between the wiring connection part and the support member and a wiring extending from the wiring connection part.

The wiring part may be formed by patterning a conductive layer for wiring or a conductive part for wiring, the conductive layer and conductive part being formed by deposition.

The deposition may include sputtering.

The wiring part may be formed by patterning using photolithography.

The electrode part may be formed by patterning a conductive layer for an electrode, the conductive layer being formed on the wiring part, the conductive layer for wiring, or the conductive part for wiring by wet coating and including a nano metal material.

The method may include forming a conductive layer for wiring over an entire surface of the support member by deposition or forming a conductive part for wiring to correspond to a position at which the wiring part is to be formed, forming the wiring part by patterning the conductive layer or the conductive part, forming a conductive layer for an electrode on the wiring part, and forming the electrode part by patterning the conductive layer for an electrode.

The method may include forming a conductive layer for wiring over an entire surface of the support member by deposition or forming a conductive part for wiring to correspond to a position at which the wiring part is to be formed, forming a conductive layer for an electrode on the conductive layer or the conductive part, forming the electrode part by patterning the conductive layer for an electrode, and forming the wiring part by patterning the conductive part for wiring.

BRIEF DESCRIPTION OF THE DRAWINGS

Details of the embodiments will be more clearly understood from the following detailed description taken in conjunction with the accompanying drawings, in which.

DETAILED DESCRIPTION OF EMBODIMENTS

Figure 1:
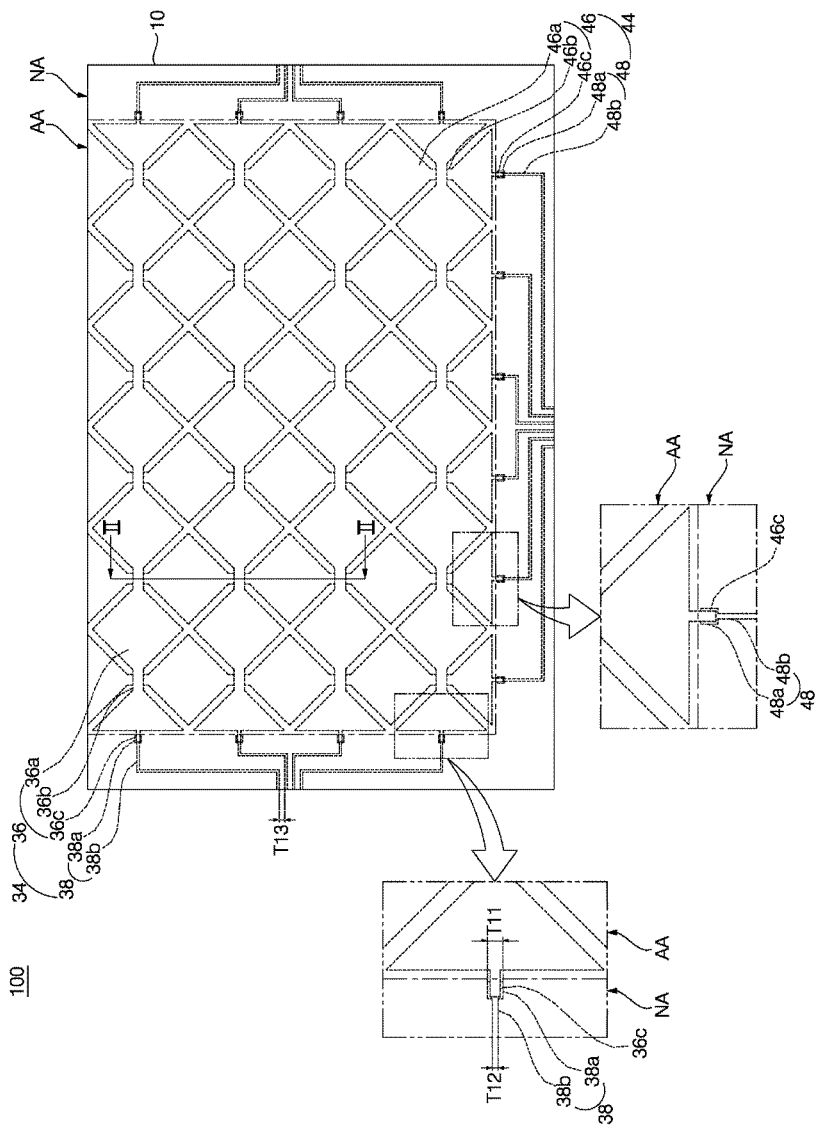
FIG. 1 is a plan view of a touch panel according to a first exemplary embodiment of the present invention.

Reference will now be made in detail to embodiments, examples of which are illustrated in the accompanying drawings. However, the present disclosure may be embodied in many different forms and should not be construed as limited to the embodiments set forth herein.

Elements necessary to understand the disclosure are illustrated in the accompanying drawings and unnecessary elements that will not be described are omitted from the drawings, for clarity of description. Like or almost the same reference numerals refer to like elements throughout. In the drawings, the thicknesses, areas and the like of constituent elements may be exaggerated or reduced for clarity and convenience of illustration. The disclosure is not limited to the illustrated thicknesses, areas, and the like.

It will be further understood that, throughout this specification, when one element is referred to as "comprising" another element, the term "comprising" specifies the presence of another element but does not preclude the presence of other additional elements, unless context clearly indicates otherwise. In addition, it will be understood that when one element such as a layer, a film, a region or a plate is referred to as being "on" another element, the one element may be directly on the other element and one or more intervening elements may also be present. In contrast, when one element such as a layer, a film, a region or a plate is referred to as being "directly on" another element, one or more intervening elements are not present.

Hereinafter, a touch panel according to exemplary embodiments of the present invention and a method of manufacturing a conductive layer used for the same will be described in detail with reference to the accompanying drawings.

Figure 2:
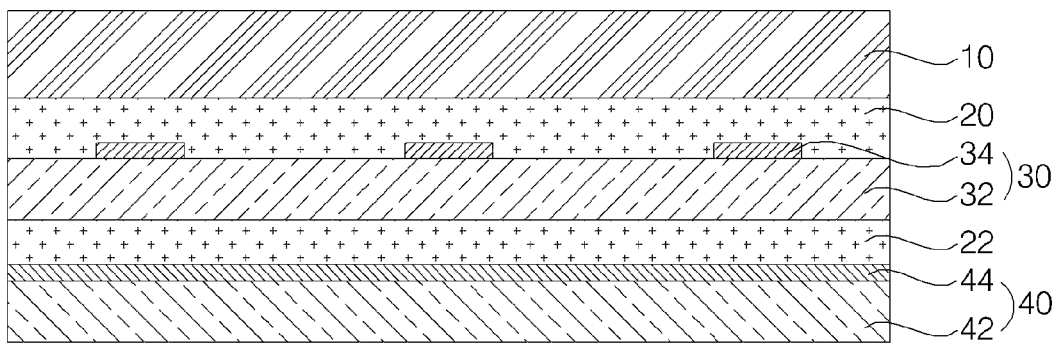
FIG. 2 is a sectional view taken along line II-II of FIG. 1.

FIG. 1 is a plan view of a touch panel 100 according to a first exemplary embodiment of the present invention. FIG. 2 is a sectional view taken along line II-II of FIG. 1.

Referring to FIGS. 1 and 2, the touch panel 100 according to the present embodiment includes an active area AA in which electrode parts 36 and 46 to sense touch of a hand of a user, a stylus pen, or the like are disposed and a non-active area NA in which wiring parts 38 and 48 connected to the outside (an external circuit or a flexible printed circuit board (FPCB) for connection to an external circuit, or the like) are disposed so as to transmit information sensed by the active area AA. The touch panel 100 may be attached to various electronic devices (e.g., a display device) to sense touch, and the non-active area NA is not involved in display, touch, and the like and is an area in which bezels or the like are formed. This will be described below in more detail.

The touch panel 100 according to the present embodiment may include a cover board 10, a first transparent adhesive layer 20 disposed on the cover board 10, a first conductive film 30 disposed on the first transparent adhesive layer 20, a second transparent adhesive layer 22 disposed on the first conductive film 30, and a second conductive film 40 disposed on the second transparent adhesive layer 22. In this regard, the first conductive film 30 includes a first base member 32 and a first conductive layer 34 formed thereon and including first electrode parts 36 and first wiring parts 38, and the second conductive film 40 includes a second base member 42 and a second conductive layer 44 formed thereon and including second electrode parts 46 and second wiring parts 48. However, the disclosure is not limited to the above examples, and the first and second conductive layers 34 and 44 may be formed on various support members (e.g., the cover board 10, a separate substrate, a separate sheet or film, or the like), rather than the first and second base members 32 and 34.

The cover board 10 protects the touch panel 100 from external impact and may be made of a material that allows light to pass through the touch panel 100. For example, the cover board 10 may include glass or the like. However, the disclosure is not limited to the above example and the cover board 10 may be made of various other materials.

The first and second conductive films 30 and 40 may be disposed on the cover board 10 (on a lower surface of the cover board 10 as seen in the drawings). The first conductive film 30 may include the first base member 32 and the first conductive layer 34 formed thereon, and the second conductive film 40 may include the second base member 42 and the second conductive layer 44. In addition, the first conductive layer 34 may include the first electrode parts 36 extending in a first direction (a transverse direction of the drawings) and the first wiring parts 38 respectively connected thereto, the second conductive layer 44 may include the second electrode parts 46 extending in a second direction (a vertical direction of the drawings) crossing the first electrode parts 34 and the second wiring parts 48, respectively, connected thereto. Directions in which the first and second electrode parts 36 and 46 extend may be opposite to the above example and various other modifications are also possible.

The first and second base members 32 and 42 may be films, sheets, substrates or the like. The first and second base members 32 and 42 may be made of a material that maintains mechanical strength of the first and second conductive films 30 and 40 and has optical transparency. The first and second base members 32 and 42 may include at least one selected from among polyethylene, polypropylene, polyethylene terephthalate, polyethylene-2,6-naphthalate, polypropylene terephthalate, polyimide, polyamideimide, polyethersulfone, polyetheretherketone, polycarbonate, polyarylate, cellulose propionate, polyvinyl chloride, polyvinylidene chloride, polyvinyl alcohol, polyetherimide, polyphenylene sulfide, polyphenylene oxide, and polystyrene. For example, the first and second base members 32 and 42 may be formed of polyethylene terephthalate. However, the disclosure is not limited to the above examples, and the first and second base members 32 and 42 may be formed of various other materials.

Each first electrode part 36 of the first conductive layer 34 may include first sensor parts 36a formed in the active area AA, first connection parts 36b that connect adjacent ones of the first sensor parts 36a, and first wiring connection parts 36c that extend from the respective first sensor parts 36a or the respective first connection parts 36b formed in the active area AA and are disposed in the respective non-active areas NA.

The first sensor parts 36a are portions to substantially sense touch of an input device such as a finger or the like. FIG. 1 illustrates that the first sensor parts 36a have a rhomboidal shape and are formed in the active area AA together with second sensor parts 46a over a wide area to effectively sense touch. However, the disclosure is not limited to the above example, and the first sensor parts 36a may have various polygonal shapes such as a triangle, a tetragon, or the like; or a circular shape such as a circle, an oval, or the like. The first connection parts 36b connect the first sensor parts 36a to one another in a first direction (a transverse direction of FIG. 1). Accordingly, the first electrode part 36 may extend in the first direction within the active area AA.

The first wiring connection part 36c extends from the first sensor part 36a or the first connection part 36b, is disposed in the non-active area NA, and is connected to and contacts the first wiring part 38. Although FIG. 1 illustrates that the first wiring connection part 36c extends from the first sensor part 36a, the first wiring connection part 36c may extend from the first connection part 36b without being limited to the above example. In this regard, the first wiring connection part 36c has a stacked structure together with at least a portion (i.e., a first electrode connection part 38a) of the first wiring part 38 so as to form a stable connection to the first wiring part 38. This will be described below in further detail when describing the first wiring part 38.

The first electrode part 36 may include a transparent conductive material that is conductive and optically transmissive. For example, the first electrode part 36 may include an oxide such as indium-tin oxide (ITO) or the like or a metallic material having a network structure (e.g., a mesh structure such as silver nanowires, copper nanowires, platinum nanowires, or the like).

When the first electrode parts 36 include an oxide such as ITO, the first electrode parts 36 may be formed using various methods such as deposition, coating, and the like.

In another exemplary embodiment, when the first electrode parts 36 include a nano metal material, the first electrode parts 36 may be formed by wet coating performed at lower cost than deposition. That is, the first electrode parts 36 may be formed by performing wet coating of a paste, ink, mixture, solution or the like including a nano metal material such as nanowires or the like, and patterning the coated material. In this regard, the concentration of the nano metal material is very low (e.g., 1% or less) in the solution, mixture, paste or the like used in wet coating. Accordingly, cost for formation of the first electrode parts 36 may be reduced, and thus, productivity may be enhanced.

As such, when the first electrode parts 36 include a nano metal material, the first electrode parts 36 have optically transmissive properties, low resistance, and excellent electrical properties. For example, surfaces of silver (Ag) nanoparticles have various crystal planes, and thus, anisotropic growth thereof may be easily induced, thereby easily fabricating Ag nanowires. Ag nanowires have a sheet resistance of about 10Ω/□ to about 400Ω/□, which is a relatively low resistance (e.g., 10Ω/□ to about 150Ω/□). Accordingly, the first electrode parts 36 having various sheet resistances may be formed. In particular, the first electrode parts 36 may have higher electrical conductivity than that of ITO having a sheet resistance of about 200Ω/□ to about 400Ω/□. In addition, Ag nanowires have higher transmittance than that of ITO, e.g., a transmittance of 90% or greater. In addition, Ag nanowires are flexible, and thus, may be suitable for use in flexible devices. Also, the supply of Ag is stable.

The above-described nanowires (particularly Ag nanowires) may have, for example, a radius of about 10 nm to about 60 nm and a major axis of about 10 μm to about 200 μm. Such nanowires have a high aspect ratio (e.g., about 1:300 to about 1:20000) within the above-described ranges, and thus, may satisfactorily form a network structure and allow the first electrode parts 36 not to be exposed to the outside. However, the disclosure is not limited to the above example and radius, major axis, and aspect ratio of nanowires may have various values.

As such, in the present embodiment, the first electrode parts 36 may be formed of a nano metal material that forms a network structure, and thus, raw material costs may be reduced and various performance characteristics may be enhanced.

The thickness of the first electrode parts 36 may vary according to the size of the touch panel 100, required resistance value, and a material of the first electrode parts 36. In this regard, the thickness of the first electrode parts 36 may be minimized when including metal nanowires having a network structure. For example, the first electrode parts 36 may have a thickness of 50 nm to 350 nm.

The first wiring parts 38 may be disposed in the non-active area NA and each of the first wiring parts 38 is connected to the first wiring connection part 36c at a portion adjacent to the active area AA. More particularly, the first wiring part 38 may include the first electrode connection part 38a having a stacked structure together with the wiring connection part 36c to be electrically connected thereto and a first wiring 38b extending from the first electrode connection part 38a to the outside.

In the present embodiment, the first electrode connection part 38a may be disposed between the first wiring connection part 36c and the first base member 32, and the first wiring parts 38 may be formed on the first base member 32. That is, the first electrode connection part 38a is closer to the first base member 32 than the first wiring connection part 36c. For example, the first electrode connection part 38a is disposed between the first base member 32 and the first wiring connection part 36c to be in contact therewith, and the first wirings 38b contacts the first base member 32. In addition, the first wiring connection parts 36c are spaced apart from the first base member 32. This is because the first wiring parts 38 are formed on the first base member 32 and then the first electrode parts 36 are formed thereon. As such, when the first wiring parts 38 are formed before the first electrode parts 36, damage to the first electrode parts 36 caused when forming the first wiring parts 38, or reduction in adhesion between the first base member 32, the first electrode parts 36, and the first wiring parts 38 may be prevented. This will be described below in more detail when describing a manufacturing method.

The first electrode connection part 38a and the first wiring connection part 36c may be stably connected to each other by making the width of the first electrode connection part 38a greater than that of the first wiring 38b. In addition, in the present embodiment, the first wiring parts 38b are formed by patterning after metal deposition and thus the width of the first wiring 38b may be reduced and, accordingly, the area of the non-active area NA may be reduced. This will be described below in further detail when describing a manufacturing method.

For example, the first electrode connection part 38a may have a width T11 of about 1 mm to about 5 mm, for example, about 1 mm to about 2 mm, and the first wiring 38b may have a width T12 of about 10 μm to about 100 μm, for example, about 30 μm to about 60 μm. In addition, a minimum distance T13 (the smallest distance among distances between adjacent first wirings 38b disposed at an edge portion) may be about 10 µm to about 100 µm, for example, about 30 µm to about 60 µm.

When the width T11 of the first electrode connection part 38a is less than about 1 mm, connection between the first electrode connection part 38a and the first wiring connection part 36c may not be stable or resistance may increase. When the width T11 of the first electrode connection part 38a exceeds about 5 mm, the area of the first electrode connection part 38a may unnecessarily increase. In this regard, when the width T11 of the first electrode connection part 38a is about 1 mm to about 2 mm, the density of the first electrode parts 36 is increased, and thus, touch sensitivity may be enhanced.

When the width T12 of the first wiring 38b is less than about 10 µm, the first wiring 38b may be disconnected or fabrication of the first wiring 38b may be difficult. When the width T12 of the first wiring 38b exceeds about 100 µm, it is difficult to reduce the area of the non-active area NA. Thus, to stably form the first wiring 38b and to minimize the area of the non-active area NA, the width of the first wiring 38b may be about 30 µm to about 60 µm.

When the minimum distance T13 between the first wirings 38b is less than about 10 µm, interference between the first wirings 38b may occur or fabrication of the first wirings 38b may be difficult. When the minimum distance T13 between the first wirings 38b exceeds about 100 µm, it is difficult to reduce the area of the non-active area NA. Thus, to prevent interference between the first wirings 38b and to minimize the area of the non-active area NA, the minimum distance between the first wirings 38b may be about 30 µm to about 60 µm.

In addition, the width T11 of the first electrode connection part 38a may be the same as or greater than that of the first wiring connection part 36c. Accordingly, structural stability of a portion at which the first electrode connection part 38a and the first wiring connection part 36c are stacked may be enhanced. In addition, the width T12 of the first wiring 38b may be less than that of the first wiring connection part 36c. Accordingly, the width of the non-active area NA may be effectively reduced.

However, the disclosure is not limited to the above examples. Thus, the width T11 of the first electrode connection part 38a, the width T12 of the first wiring 38b, and the minimum distance T13 between the first wirings 38b may vary according to the size of the touch panel 100, the number of the first electrode parts 36, the material of the first wiring part 38, and the like.

For example, the first wiring parts 38 may have a thickness of about 100 nm to about 200 nm. When the thickness of the first wiring parts 38 is less than about 100 nm, adhesion between the first wiring parts 38 and the first base member 32 may be reduced and it may be difficult for the first wiring parts 38 to have low resistance. When the thickness of the first wiring parts 38 exceeds about 20 nm, raw material costs may be increased. However, the disclosure is not limited to the above example, and the thickness of the first wiring parts 38 may vary according to the size of the touch panel 100, required resistance value, the material of the first wiring parts 38, and the like. In addition, stability of a connection portion between the first electrode connection part 38a and the first electrode part 36 may be increased by making the thickness of the first electrode connection part 38a greater than that of the first wiring 38b. In another embodiment, the thickness of the connection portion between the first electrode connection part 38a and the first electrode part 36 may be reduced by making the thickness of the first electrode connection part 38a smaller than that of the first wiring 38b, whereby a difference between thicknesses of the corresponding portion and another portion may be minimized. Various other modifications are also possible.

FIG. 1 illustrates a double routing structure in which the first wiring parts 38 are disposed at opposite sides of the first electrode parts 36. Accordingly, the first wiring parts 38 are formed in the non-active areas (NA) (hereinafter referred to as a first NA) disposed at opposite side portions (i.e., left and right sides) of the active area AA. However, the disclosure is not limited to the above example and the first wiring parts 38 may be disposed at at least one of upper, lower, left, and right sides of the active area AA. Various other modifications are also possible.

In this regard, the first wiring parts 38 may be formed of a metal and formed by patterning using various methods after deposition by sputtering or the like. The first wiring parts 38 may include a metal layer including various materials (e.g., metal materials) having high electrical conductivity. That is, the first wiring parts 38 may include a metal layer formed of various metal materials such as copper, gold, silver, platinum, titanium, tungsten, and the like. When the first wiring parts 38 are formed of copper, the first wiring parts 38 may have high electrical conductivity with lower cost. In another embodiment, the first wiring parts 38 may have very high electrical conductivity when including gold, silver, platinum, or the like. The metal layer may contact the first base member 32 and the first wiring connection part 36c, but the disclosure is not limited thereto.

In FIG. 1, a double routing structure in which the first wiring parts 38 are disposed at opposite ends of the first electrode parts 36 is illustrated. Such configuration is intended to prevent signal loss by reducing resistance of the first electrode parts 36 as the first electrode parts 36 are relatively long. However, the disclosure is not limited to the above example and the first wiring part 38 may be connected to only a side of the first electrode part 36. Various other modifications are also possible.

In addition, in the drawings, it is illustrated that the first wiring parts 38 are connected to the outside via the two non-active areas respectively disposed at opposite sides of the active area AA. However, the disclosure is not limited to the above example, and the first wiring part 38 may be connected to the outside via a single non-active area NA disposed at one side of the active area AA or the first wiring part 38 may be connected to the outside by extending to any one of upper and lower sides of the active area AA. Various other modifications are also possible.

Each second electrode part 46 of the second conductive layer 44 may include second sensor parts 46a formed in the active area AA, second connection parts 46b that connect adjacent ones of the second sensor parts 46a, and a second wiring connection part 46c that extends from the second sensor part 46a or the second connection part 46b formed in the active area AA and disposed in the non-active area NA.

The second sensor parts 46a are portions to substantially sense touch of an input device such as a finger or the like. FIG. 1 illustrates the second sensor parts 46a as having a rhomboidal shape. However, the disclosure is not limited to the above example, and the second sensor parts 46a may have various polygonal shapes such as a triangle, a tetragon, or the like; or a circular shape such as a circle, an oval, or the like. The second connection parts 46b connect the second sensor parts 46a to one another in a second direction (a vertical direction of the drawings). Accordingly, the second electrode part 46 may extend in the second direction within the active area AA.

The second wiring connection part 46c may extend from the second sensor part 46a or the second connection part 46b, may be disposed in the non-active area NA, and may be connected to and contact the second wiring part 48. Although FIG. 1 illustrates that the second wiring connection part 46c extends from the second sensor part 46a, the second wiring connection part 46c may extend from the second connection part 46b without being limited to the above example. In this regard, the second wiring connection part 46c has a stacked structure together with at least a portion (i.e., a second electrode connection part 48a) of the second wiring part 48 so as to form a stable connection to the second wiring part 48. This will be described below in further detail when describing the second wiring part 48.

The material of the second electrode parts 46 may be the same as or similar to that of the first electrode parts 36 and a detailed description thereof will thus be omitted as redundant.

The thickness of the second electrode parts 46 may vary according to the size of the touch panel 100, required resistance value, the material of the second electrode parts 46, and the like. In this regard, the thickness of the second electrode parts 46 may be minimized when including metal nanowires having a network structure. For example, the second electrode parts 46 may have a thickness of about 50 nm to about 350 nm.

The second wiring parts 48 may be disposed in the non-active area NA and each second wiring part 48 may be connected to the second wiring connection part 46c at a portion adjacent to the active area AA. More particularly, the second wiring part 48 may include the second electrode connection part 48a having a stacked structure together with the wiring connection part 46c to be electrically connected thereto, and a second wiring 48b extending from the second electrode connection part 48a to the outside.

In the present embodiment, the second electrode connection part 48a may be disposed between the second wiring connection part 46c and the second base member 42, and the second wirings 48 are formed on the second base member 42. That is, the second electrode connection part 48a may be closer to the second base member 42 than the second wiring connection part 46c. For example, the second electrode connection part 48a may be disposed between the second base member 42 and the second wiring connection part 46c to be in contact therewith, and the second wirings 48b contact the second base member 42. In addition, the second wiring connection parts 46c are spaced apart from the second base member 42. This is because the second wiring parts 48 are formed on the second base member 42, and then the second electrode parts 46 are formed thereon. As such, when the second wiring parts 48 are formed before the second electrode parts 46, damage to the second electrode parts 46 caused when forming the second wiring parts 48 or reduction in adhesion among the second base member 42, the second electrode parts 46, and the second wiring parts 48 may be prevented. This will be described below in more detail when describing a manufacturing method.

The width of the second electrode connection part 48a, the width of the second wiring 48b, a minimum distance between the second wirings 48b, and the thickness of the second wiring part 48 are the same as or similar to the width T11 of the first electrode connection part 38a, the width T12 of the first wiring 38b, the minimum distance T13 between the first wirings 38b, and the thickness of the first wiring part 38, and thus, a detailed description thereof will be omitted for brevity.

In FIG. 1, a single routing structure in which the second wiring parts 48 are respectively disposed at lower sides of the second electrode parts 46 is illustrated. Accordingly, the second wiring parts 48 are formed in the non-active area NA (hereinafter referred to as a second non-active area NA) disposed at a lower side of the active area AA. However, the disclosure is not limited to the above example, and the second wiring parts 48 may be disposed at at least one of upper, lower, left, and right sides of the active area AA. Various other modifications are also possible.

In this regard, the second wiring parts 48 may be formed of a metal and may be formed by patterning using various methods after deposition by sputtering or the like. The second wiring part 48 may include a metal layer including various materials (e.g., metal materials) having relatively high electrical conductivity. That is, the second wiring part 48 may include a metal layer formed of various metal materials such as copper, gold, silver, platinum, titanium, tungsten, and the like. When the second wiring parts 48 are formed of copper, the second wiring parts 48 may have relatively high electrical conductivity at lower cost. In another embodiment, the second wiring parts 48 may have a relatively very high electrical conductivity when including gold, silver, platinum, or the like. The metal layer may contact the second base member 42 and the second wiring connection part 46c, but the disclosure is not limited thereto.

In the drawings and the foregoing description, for clear and brief explanation, it is illustrated and described that the first conductive film 30 may include the first base member 32 and the first conductive layer 34, and the second conductive film 40 may include the second base member 42 and the second conductive layer 44. However, the disclosure is not limited to the above examples. Thus, each of the first and second conductive films 30 and 40 may further include an over coating layer for protection of the first and second conductive films 30 and 40, a hard coating layer, or an adhesive layer, a primer layer and the like for enhancement of adhesive properties between stacked layers. The first and second conductive films 30 and 40 may have various structures.

When an input device such as a finger, stylus, or the like touches the first and second sensor parts 36a and 46a, a difference in capacitance occurs at a portion at which the input device is touched. The portion at which such capacitance difference occurs may be detected as a touch position.

The first transparent adhesive layer 20 may be disposed between the cover board 10 and the first conductive film 30 to adhere the cover board 10 to the first conductive film 30, and the second transparent adhesive layer 22 may be disposed between the first conductive film 30 and the second conductive film 40 to adhere the first conductive film 30 to the second conductive film 40. Thus, the layers constituting the touch panel 100 may be joined by the first and second transparent adhesive layers 20 and 22.

The first and second transparent adhesive layers 20 and 22 may be formed of a material having adhesive properties that allow layers disposed at opposite sides of each transparent adhesive layer to be adhered, and also include optically transmissive properties, i.e., an optically clear adhesive (OCA). The OCA may have relatively high adhesion, and may prevent deterioration of the first and second conductive layers 34 and 44. The OCA may also have high moisture resistance, high heat resistance, excellent foaming properties, and high processability.

In the present embodiment, it is illustrated that the first conductive layer 34 may be formed in the first conductive film 30 and the second conductive layer 44 may be formed in the second conductive film 40, but the disclosure is not limited thereto. Various other modifications are also possible. This will be described below in more detail with reference to FIGS. 4 to 8.

In addition, in the present embodiment, it is illustrated that the first electrode connection part 38a may be disposed between the first base member 32 and each first wiring connection part 36c, and the second electrode connection part 48a may be disposed between the second base member 42 and each second wiring connection part 46c. However, only one of the first and second electrode connection parts 38a and 48a may have the above-described structure.

In the touch panel 100, the first and second conductive layers 34 and 44 (hereinafter generically referred to as a conductive layer 54) are configured such that the first and second wiring parts 38 and 48 (hereinafter generically referred to as a wiring part 58) are formed on the first and second base members 32 and 42 (hereinafter generically referred to as a base member 52) before formation of the first and second electrode parts 36 and 46 (hereinafter generically referred to as an electrode part 56). Accordingly, when forming the wiring part 58, damage to the electrode part 56 or reduction in adhesion between the base member 52 and the wiring part 58 may be prevented. Hereinafter, a method of manufacturing the touch panel 100 will be described in more detail with reference to FIGS. 3a to 3f.

Figure 3A:
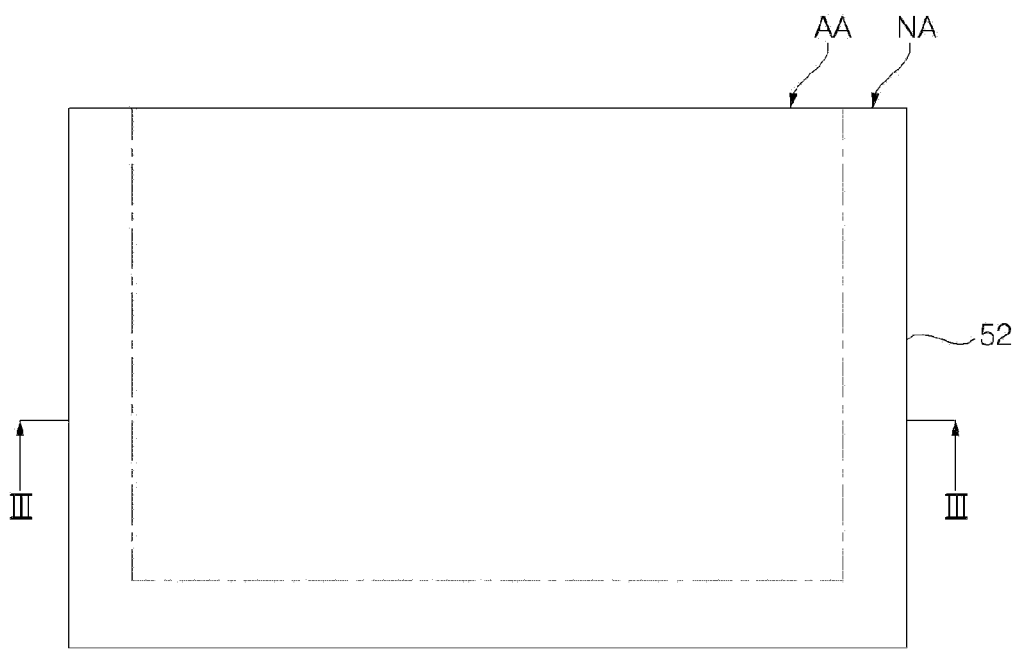
FIGS. 3a to 3f are views illustrating a method of manufacturing a conductive layer for a touch panel, according to the first exemplary embodiment of the present invention.
Figure 3A:
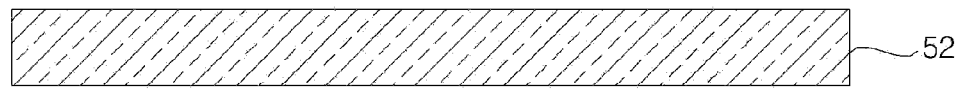

FIGS. 3a to 3f are views illustrating a method of manufacturing the conductive layer 54 of the touch panel 100, according to an exemplary embodiment of the present invention. Although FIGS. 3a to 3f illustrate the conductive layer 54 as having the shape of the first conductive layer 34 (see FIGS. 1 and 2), this is only given as an example. Thus, in the following description, the previous description of the second conductive layer 44 (see FIGS. 1 and 2) may also be applied to the conductive layer 54. FIGS. 3a(a) to 3f(a) are plan views of the touch panel 100 illustrated in FIG. 1, and FIGS. 3a(b) to 3f(b) are sectional views taken along line of each (b). A detailed description of same elements as those of the previous embodiment will be omitted herein for brevity and a detailed description of different elements will be provided.

First, as illustrated in FIG. 3a, the base member 52 may be prepared as a support member.

Figure 3B:
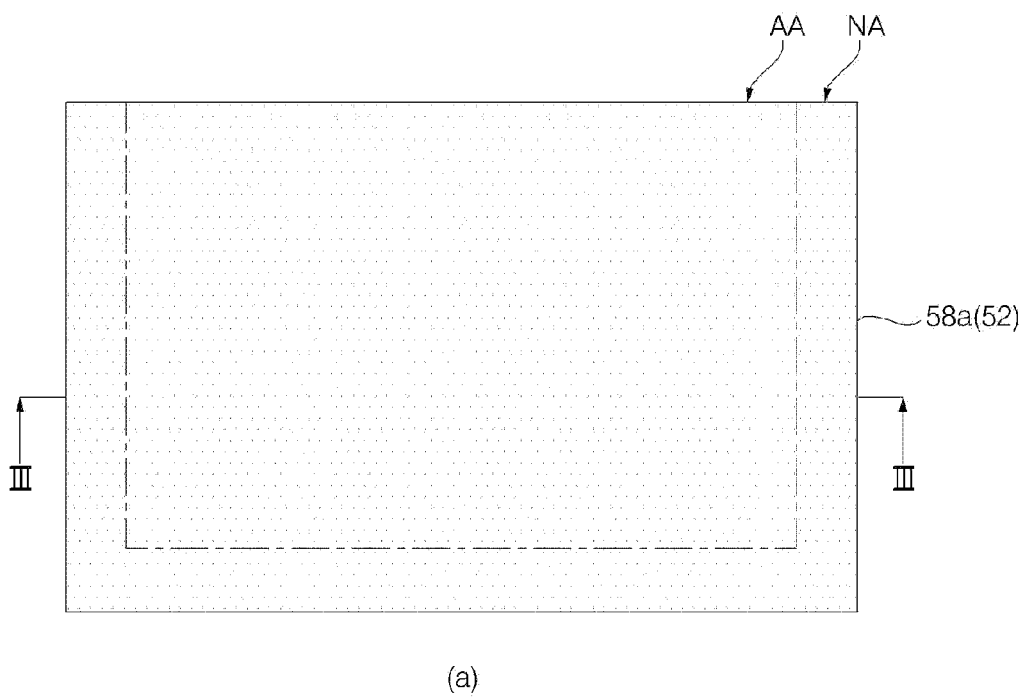
Figure 3B:
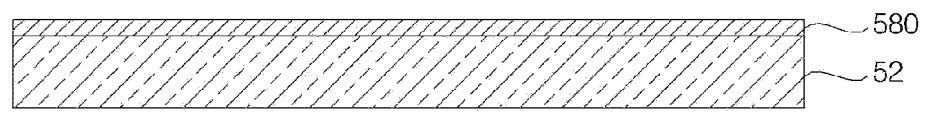

Subsequently, as illustrated in FIG. 3b, a conductive layer for wiring 580 is formed over the entire surface of the base member 52. The conductive layer 580 may be formed by deposition (more particularly, sputtering) of a metal material such as copper, gold, silver, platinum, titanium, tungsten, or the like. As such, when the conductive layer 580 is formed by deposition, the conductive layer 580 may be formed to a uniform thickness and may be patterned to form the wiring parts 58 (see FIG. 3d) having a narrow width.

Figure 3C:
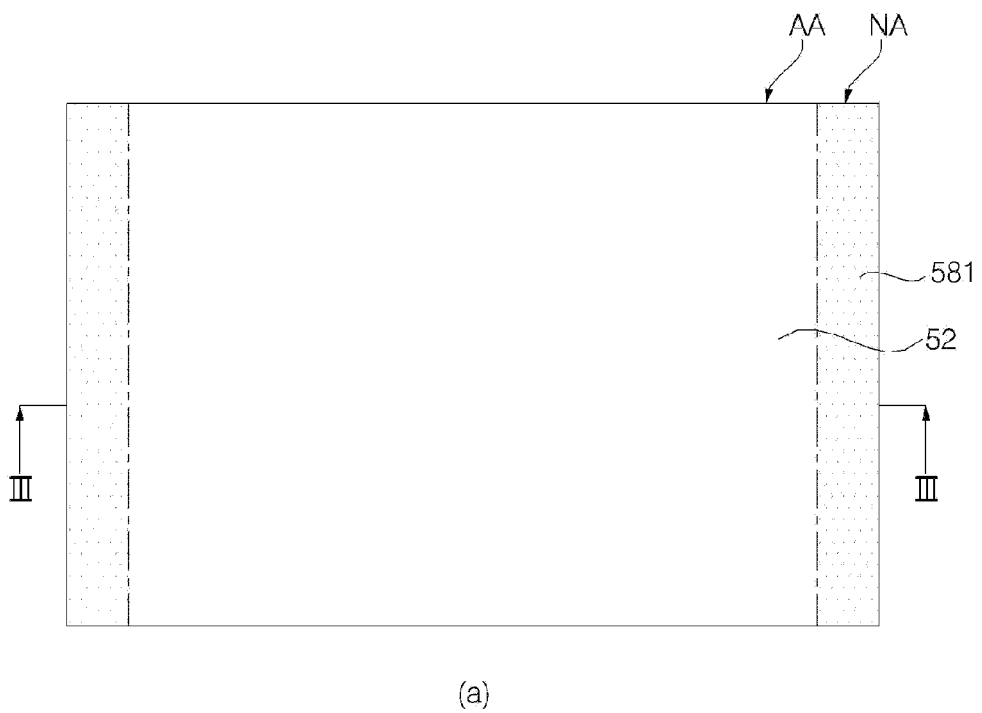
Figure 3C:
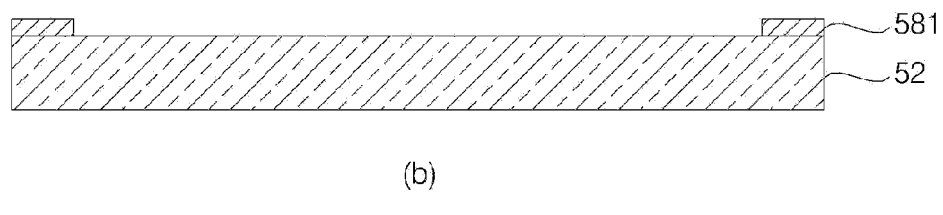

Subsequently, as illustrated in FIG. 3c, a portion of the conductive layer 580 (see FIG. 3b) at which the wiring parts 58 are not positioned is removed and conductive parts 581 for wiring remain in non-active areas in which the wiring parts 58 are formed. For example, when forming the first conductive layer 34, an active area AA and non-active areas (NA) disposed at upper and lower sides of the active area AA are removed to leave behind the conductive parts 581 in first non-active areas NA formed at left and right sides of the active area AA. In another embodiment, when forming the second conductive layer 44, an active area AA and non-active areas disposed at left, right and upper sides of the active area AA may be removed to leave behind a conductive part 581 for wiring in a second non-active area NA formed at a lower side of the active area AA.

In this regard, a region of the conductive layer 580 including the active area AA may be removed by etching using a mask or a mask layer (not shown). However, the disclosure is not limited to the above example and various methods may be used.

In addition, in the present embodiment, it is illustrated that the conductive parts 58 may be formed and patterned to form the wiring parts 58. However, the disclosure is not limited to the above example. That is, instead of entirely forming and patterning the conductive layer 580, the conductive parts 581 may be formed only at portions at which the wiring parts 58 are disposed by using a mask or a mask layer. In other words, without performing the process of FIG. 3b, the conductive parts 581 may be formed on the base member 52 only at desired portions of the non-active areas NA using a mask or a mask layer by the process of FIG. 3c.

Figure 3D:
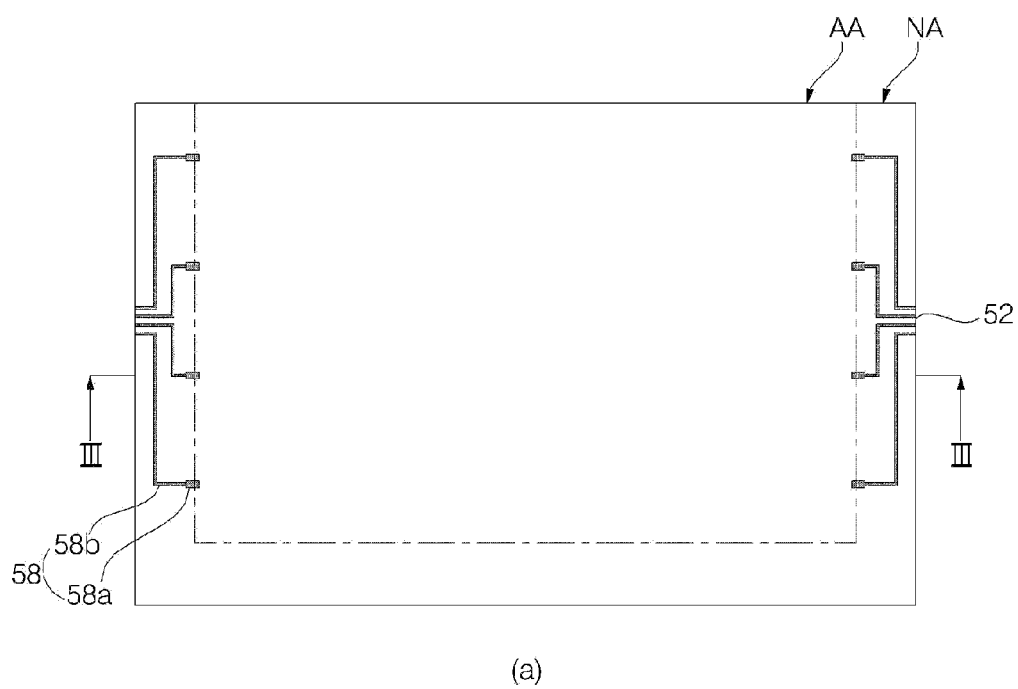
Figure 3D:

Subsequently, as illustrated in FIG. 3d, the conductive parts 581 (see FIG. 3c) formed in the non-active areas NA are patterned to form the wiring parts 58. Patterning of the conductive parts 581 may be performed using photolithography. That is, the wiring parts 58 may be formed by forming a resist layer on the conductive parts 581, performing light exposure, developing of the resist layer to form a mask layer, and etching a portion except for portions of the conductive parts 581 at which the mask layer is formed. As such, the conductive parts 581 may be patterned using photolithography to form the wiring parts 58 to a narrow width.

In the present embodiment, it is illustrated that the wiring parts 58 may be formed by patterning after the conductive parts 581 remains in the respective non-active area NA. However, the disclosure is not limited to the above example and the wiring parts 58 may be formed while removing a region of the conductive layer 580 for wiring including the active area AA.

Figure 3E:
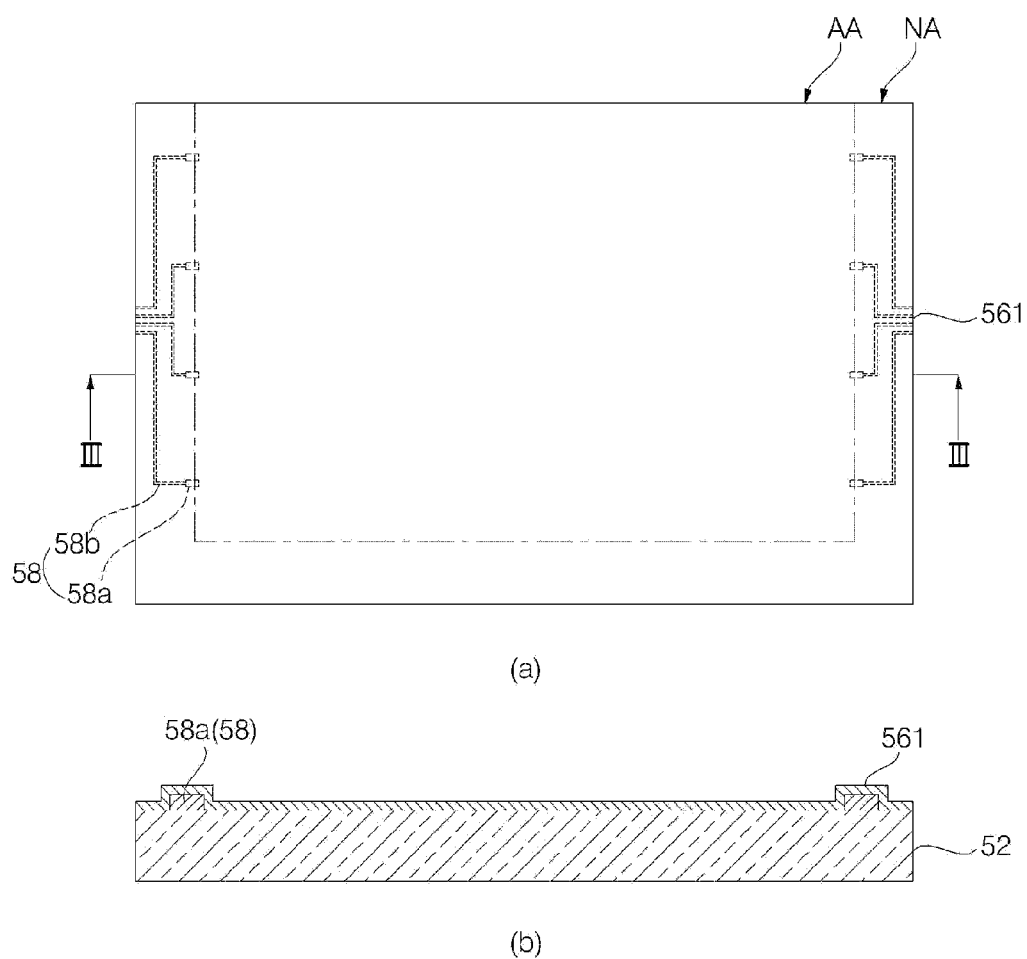

Subsequently, as illustrated in FIG. 3e, a conductive layer 561 for an electrode may be formed over the entire surface of the base member 52 so as to cover the wiring parts 58. The conductive layer 561 may be entirely formed by coating, deposition, or the like and include a transparent conductive oxide, a nano metal material, or the like. For example, when the conductive layer 561 is formed by coating of a mixture including a nano metal material and the like by wet coating and drying the coated mixture, the conductive layer 561 may have excellent characteristics using a simple manufacturing process.

Figure 3F:
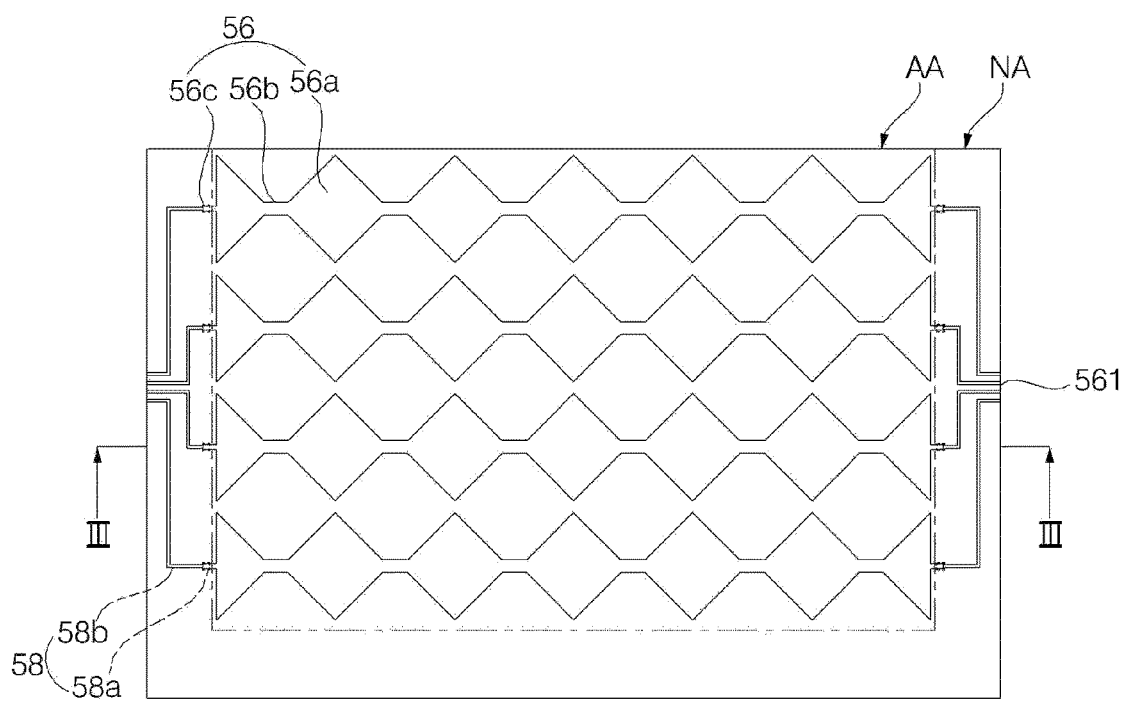
Figure 3F:
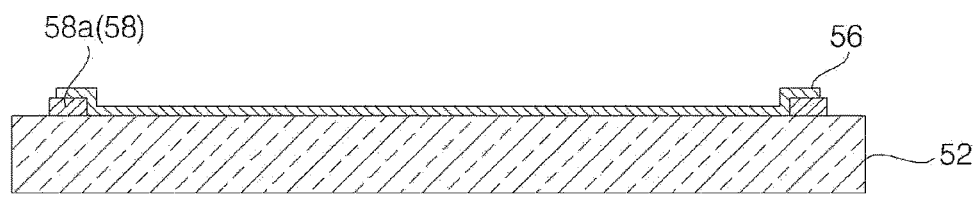

Subsequently, as illustrated in FIG. 3F, the conductive layer 561 (see FIG. 3e) is patterned to form the electrode parts 56. Each of the electrode parts 56 may include sensor parts 56a and connection parts 56b disposed in the active area AA and a wiring connection part 56c disposed on an electrode connection part 58a in the non-active area NA.

Patterning of the conductive layer 561 may be performed using photolithography. That is, the electrode parts 56 may be formed by forming a resist layer on the conductive layer 561, performing light exposure and developing of the resist layer to form a mask layer, and etching a portion except for a portion of the conductive layer 561 at which the mask layer is formed. As such, the conductive layer 561 may be patterned using photolithography to form the electrode parts 56 to a narrow width.

In the present embodiment, it is illustrated that the conductive layer 580 for wiring or the conductive parts 581 for wiring are patterned before forming the conductive layer 561 for an electrode. However, the disclosure is not limited to the above example. That is, the conductive layer 580 for wiring or the conductive parts 581 for wiring may be formed, the conductive layer 561 for an electrode may be formed, the conductive layer 561 may be patterned, and the conductive layer 580 for wiring or the conductive parts 581 for wiring may be patterned, or the conductive layer 561 for an electrode and the conductive layer 580 for wiring or the conductive parts 581 for wiring may be simultaneously patterned. Various other modifications are also possible.

A conductive film including the conductive layer 58 may be adhered to a structure formed by stacking the cover board 10, the first and second transparent adhesive layers 20 and 22, another conductive layer, and the like and fixed thereto, thereby constituting a touch panel. A protective film for preventing oxidation of the conductive layer 58 may be laminated on the base member 52 so as to cover the above-described conductive layer 58, and the protective film may be removed before the stacking process described above.

In the present embodiment, as described above, the wiring parts 58 are formed before the electrode parts 56.

Conventionally, electrode parts are formed before wiring parts and, in this case, there is a limitation in fabrication of wiring parts. In addition, when a manufacturing process such as deposition or the like is used, electrode parts may be damaged or separated when deposition of wiring parts is performed, and adhesive strength of wiring parts is also reduced as adhesive strength of electrode parts decreases. In particular, when electrode parts include a nano metal material, adhesion between electrode parts and a base member is low, and thus, adhesion between the base member, the electrode parts, and the wiring parts is significantly reduced. Adhesive strength of a film formed in a deposition process increases as hardness of an object to be deposited increases. In this regard, when hardness decreases due to an over coating layer or the like when forming electrode parts, the adhesive strength of wiring parts is also reduced. Conventionally, wiring parts are formed on electrode parts by printing in consideration of the above-described fact. However, there are limitations in reducing width of wiring parts and a distance therebetween, and thus, it is difficult to reduce width of a non-active area.

Unlike what has been described above, in the present embodiment, the wiring parts 58 may be formed before the electrode parts 56, and thus, there is no limitation in fabrication of the wiring parts 58. Accordingly, the wiring parts 58 may be formed by deposition, such as sputtering and patterning using photolithography, thereby minimizing the width of the wiring parts 58. In addition, deterioration of characteristics of the wiring parts 58 or damage to the electrode parts 56 or separation of the electrode parts 56 caused when forming the wiring parts 58 may be prevented by the characteristics of the electrode parts 56. In addition, since the wiring parts 58 may be formed on the base member 52, wiring parts 58 having high adhesive strength may be formed by high hardness of the base member 52.

As such, according to the present embodiment, by the order of formation of and particular manufacturing processes of the electrode parts 56 and the wiring parts 58, stability of the electrode parts 56 and the wiring parts 58 may be enhanced and the width of the non-active area NA may be significantly reduced by decreasing width of and distance between the wiring parts 58. In electronic devices including the touch panel 100 according to the present embodiment, aesthetics, user satisfaction, and the like may be significantly enhanced by reducing the non-active region NA, i.e., an area in which bezels are installed.

Hereinafter, touch panels according to other exemplary embodiments of the present invention will be described in detail. A detailed description of the same or similar elements to those of the above-described touch panel will be omitted for brevity and a detailed description of only different elements will be provided.

Figure 4:
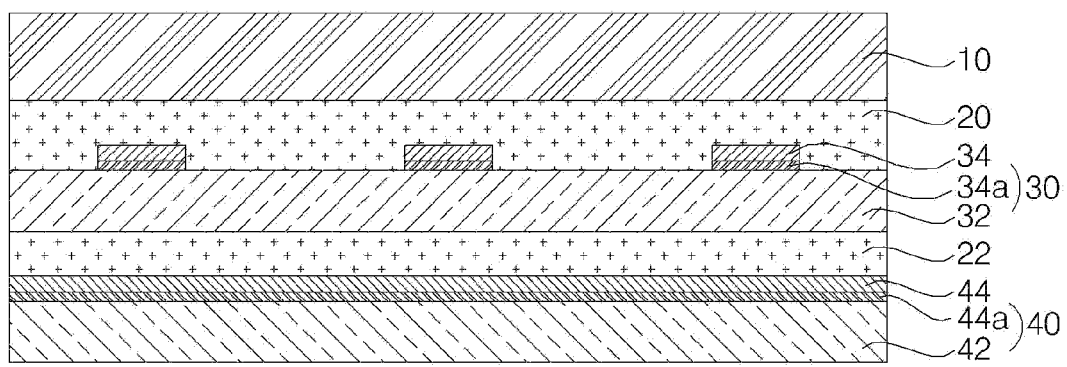
FIG. 4 is a sectional view of a touch panel according to a second exemplary embodiment of the present invention.

FIG. 4 is a sectional view of a touch panel according to a second exemplary embodiment of the present invention.

Referring to FIG. 4, in the touch panel according to the present embodiment, a first seed layer 34*a* may be formed between the first base member 32 and the first conductive layer 34. A second seed layer 44*a* may be formed between the second base member 42 and the second conductive layer 44. The first and second seed layers 34*a* and 44*a* are respectively formed between the first base member 32 and the first conductive layer 34 and between the second base member 42 and the second conductive layer 44 to contact the corresponding layers, and thus, enhance adhesion therebetween.

The first and second seeds 34*a* and 44*a* may be formed of various materials that allow enhancement of adhesion between the first base member 32 and the first conductive layer 34 and adhesion between the second base member 42 and the second conductive layer 44. For example, the first and second seed layers 34*a* and 44*a* may be formed of nickel, nichrome, or the like. In addition, the thicknesses of the first and second seed layers 34*a* and 44*a* may be respectively less than those of the first and second conductive layers 34 and 44. The first and second seed layers 34*a* and 44*a* serve to enhance adhesion, and thus, are relatively thinner.

As such, in the present embodiment, adhesive strength of the first and second conductive layers 34 and 44 may be enhanced by the first and second seed layers 34*a* and 44*a* and, accordingly, reliability of the touch panel 100 may be enhanced. In the present embodiment, a case in which both the first and second seed layers 34*a* and 44*a* are formed is illustrated, but the disclosure is not limited to the above example. That is, only one of the first and second seed layers 34*a* and 44*a* may be formed.

Figure 5:
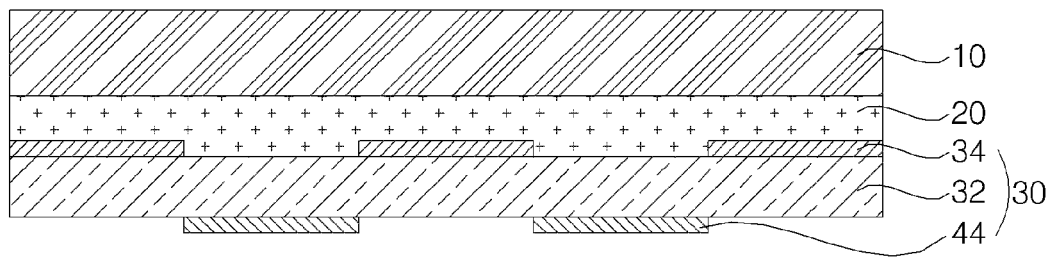
FIG. 5 is a sectional view of a touch panel according to a third exemplary embodiment of the present invention.

FIG. 5 is a sectional view of a touch panel according to a third exemplary embodiment of the present invention.

Referring to FIG. 5, the touch panel according to the present embodiment may include the cover board 10, the first transparent adhesive layer 20 disposed on the cover board 10, and the first conductive film 30 disposed on the first transparent adhesive layer 20 and provided at a first surface thereof with the first conductive layer 34 and at a second surface thereof with the second conductive layer 44. That is, in the present embodiment, the first and second conductive layers 34 and 44, which are two conductive layers included in the touch panel, are respectively disposed at opposite surfaces of the first conductive film 30. A structure of the touch panel may be simplified by such a structure and the touch panel may be thinned by reducing the number of the base members 32 having greater thicknesses.

Figure 6:
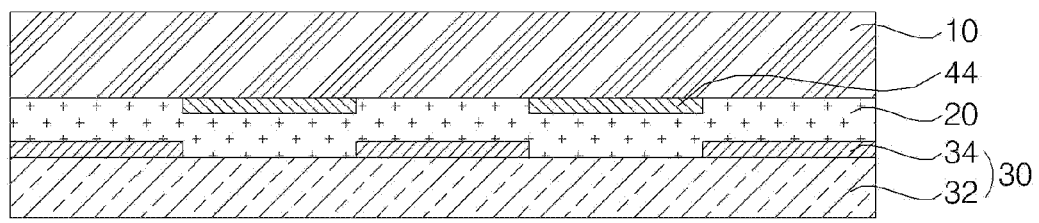
FIG. 6 is a sectional view of a touch panel according to a fourth exemplary embodiment of the present invention.

FIG. 6 is a sectional view of a touch panel according to a fourth exemplary embodiment of the present invention.

Referring to FIG. 6, the touch panel according to the present embodiment includes the cover board 10 provided with the second conductive layer 44, the first transparent adhesive layer 20 disposed on the cover board 10 so as to cover the second conductive layer 34, and the first conductive film 30 disposed on the first transparent adhesive layer 20 and provided with the first conductive layer 34. According to the present embodiment, by forming the second conductive layer 44 on the cover board 10, the structure of the touch panel may be simplified and the thickness of the touch panel may be minimized.

Figure 7:
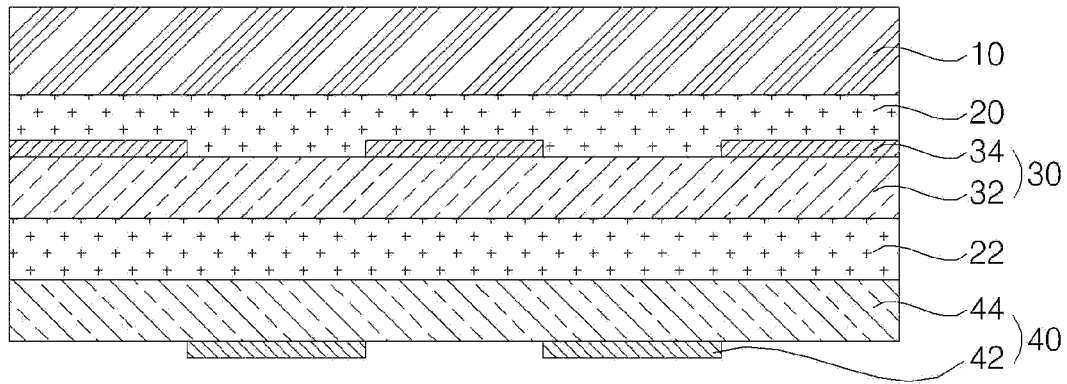
FIG. 7 is a sectional view of a touch panel according to a fifth exemplary embodiment of the present invention.

FIG. 7 is a sectional view of a touch panel according to a fifth exemplary embodiment of the present invention.

Referring to FIG. 7, in the present embodiment, the touch panel may include the cover board 10, the first transparent adhesive layer 20 disposed on the cover board 10, the first conductive film 30 disposed on the first transparent adhesive layer 20, the second transparent adhesive layer 22 disposed on the first conductive film 30, and the second conductive film 40 disposed thereon.

In the embodiment of FIG. 1, the first conductive layer 34 of the first conductive film 30 and the second conductive layer 44 of the second conductive film 40 are respectively disposed on surfaces of the base members 32 and 42 facing the cover board 10. By contrast, in the present embodiment, the first conductive layer 34 is disposed on a surface of the base member 32 of the first conductive film 30 facing the cover board 10 and the second conductive layer 44 is disposed on a surface of the base member 42 of the second conductive film 40 which is opposite the cover board 10. As such, positions and the like of the first and second conductive layers 34 and 44 may be variously modified.

Figure 8:
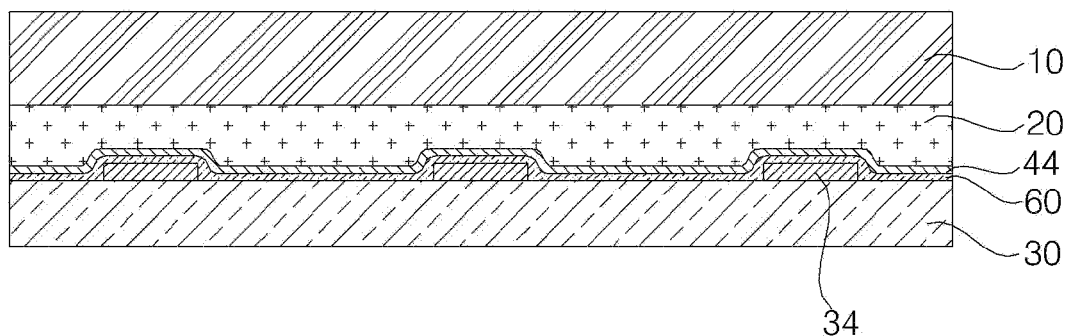
FIG. 8 is a sectional view of a touch panel according to a sixth exemplary embodiment of the present invention.

FIG. 8 is a sectional view of a touch panel according to a sixth exemplary embodiment of the present invention.

Referring to FIG. 8, the touch panel according to the present embodiment includes the cover board 10, the first transparent adhesive layer 20 disposed on the cover board 10, and the first conductive film 30 provided with the first and second conductive layers 34 and 44 with an insulating part 60 disposed therebetween formed on the first transparent adhesive layer 20. That is, in the present embodiment, the first and second conductive layers 34 and 44 with the insulating part 60 therebetween, which are two conductive layers included in the touch panel, are disposed on a surface of the first conductive film 30. Although FIG. 8 illustrates that the insulating part 60 is entirely formed while covering the second conductive layer 44, the disclosure is not limited to the above example. That is, the insulating part 60 may be disposed only at a portion at which the first conductive layer 34 and the second conductive layer 44 overlap each other. Various other modifications are also possible.

The structure of the touch panel may be simplified by such a structure and the touch panel may be thinned by reducing the number of the base members 32 having greater thicknesses.

Particular characteristics, structures, or effects described in connection with the embodiment are included in at least one embodiment of the present disclosure and not necessarily limited to only one embodiment. Furthermore, the particular characteristics, structures, or effects of any specific embodiment of the present disclosure may be combined in any suitable manner with one or more other embodiments or may be changed by those skilled in the art to which the embodiments pertain. Therefore, it is to be understood that contents associated with such combination or change fall within the spirit and scope of the present disclosure.

What is claimed is:

1. A touch panel having an active area and a non-active area formed at an outer side of the active area defined therein, the touch panel comprising:
a support member; and
a conductive layer formed on the support member and comprising an electrode part in the active area to sense touch and a wiring part disposed in the non-active area to be connected to the electrode part,
wherein, in the non-active area, the wiring part is disposed on the support member and the electrode part is partially disposed on the wiring part,
wherein the electrode part comprises a sensor part disposed in the active area and a wiring connection part electrically connected to the sensor part and disposed in the non-active area,
wherein the wiring part comprises an electrode connection part disposed between the wiring connection part and the support member and a wiring extending from the wiring connection part,
wherein a width of the wiring connection part is identical to or smaller than a width of the electrode connection part at a portion at which the wiring connection part and the electrode connection part are stacked,
wherein the electrode part comprises a first electrode extending in a first direction and a second electrode extending in a second direction different from the first direction within the active area,
wherein the support member comprises a first base member and a second base member spaced apart from the first base member, and
wherein the conductive layer comprises a first conductive layer on the first base member and a second conductive layer on the second base member, and further comprising:
a first seed layer formed between the first base member and the first conductive layer; and
a second seed layer formed between the second base member and the second conductive layer.

2. The touch panel according to claim 1, wherein the electrode connection part is formed between the wiring connection part and the support member to be in contact with the wiring connection part and the support member.

3. The touch panel according to claim 2, wherein the electrode part comprises a transparent conductive material comprising nanowires having a network structure.

4. The touch panel according to claim 3, wherein the wiring part comprises a metal layer formed by deposition.

5. The touch panel according to claim 4, wherein the wiring has a narrower width than the electrode connection part.

6. The touch panel according to claim 5, wherein the electrode connection part has a width of about 1 mm to about 5 mm, and the wiring has a width of about 10 μm to about 100 μm.

7. The touch panel according to claim 6, wherein the wiring has a width of about 30 μm to about 60 μm.

* * * * *